(12) United States Patent
Li et al.

(10) Patent No.: US 10,414,103 B2
(45) Date of Patent: *Sep. 17, 2019

(54) COVER PLATE, METHOD FOR MANUFACTURING COVER PLATE AND ELECTRONIC DEVICE

(71) Applicant: Guangdong Oppo Mobile Telecommunications Corp., Ltd., Dongguan, Guangdong (CN)

(72) Inventors: Jing Li, Guangdong (CN); Guangming Yang, Guangdong (CN); Qingguo Gong, Guangdong (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 135 days.

This patent is subject to a terminal disclaimer.

(21) Appl. No.: 15/667,897

(22) Filed: Aug. 3, 2017

(65) Prior Publication Data

US 2018/0036961 A1 Feb. 8, 2018

(30) Foreign Application Priority Data

Aug. 8, 2016 (CN) .......................... 2016 1 0645762
Aug. 8, 2016 (CN) ...................... 2016 2 0851119 U

(51) Int. Cl.
| B29C 65/78 | (2006.01) |
| B22F 9/20 | (2006.01) |
| B21D 39/00 | (2006.01) |
| B21C 27/00 | (2006.01) |
| B29C 39/10 | (2006.01) |

(Continued)

(52) U.S. Cl.
CPC ............ B29C 65/7808 (2013.01); B22F 9/20 (2013.01); B29C 39/10 (2013.01); B29C 70/74 (2013.01); H04M 1/185 (2013.01); H05K 5/04 (2013.01); *B22F 2301/255* (2013.01); *B29C 39/38* (2013.01); *B29L 2031/3456* (2013.01); *B29L 2031/3481* (2013.01)

(58) Field of Classification Search
USPC .......................................... 428/599, 623, 686
See application file for complete search history.

(56) References Cited

U.S. PATENT DOCUMENTS 7,201,828 B2 * 4/2007 Emesh ..................... B23H 3/00
204/199
2014/0098502 A1 4/2014 Lasarov et al.

FOREIGN PATENT DOCUMENTS

CN 104468883 A 3/2015
CN 104540341 A 4/2015
(Continued)

OTHER PUBLICATIONS

Extended European Search Report issued in corresponding European application No. 17181184.7 dated Dec. 22, 2017.
(Continued)

*Primary Examiner* — Tae H Yoon
(74) *Attorney, Agent, or Firm* — Young Basile Hanlon & MacFarlane, P.C.

(57) ABSTRACT

A cover plate, a method of manufacturing the cover plate, and an electronic device having the cover plate are provided. The cover plate includes a substrate, at least one slot defined in the substrate and penetrating through the substrate, and a filling layer received in the slot including an insulating layer and a gel layer located on the insulating layer.

20 Claims, 2 Drawing Sheets

(51) Int. Cl.
*H04M 1/18* (2006.01)
*H05K 5/04* (2006.01)
*B29C 70/74* (2006.01)
B29C 39/38 (2006.01)
B29L 31/34 (2006.01)

(56) References Cited

FOREIGN PATENT DOCUMENTS

| CN | 105149184 A | 12/2015 |
| CN | 105283013 A | 1/2016 |
| CN | 105517389 A | 4/2016 |
| CN | 105813422 A | 7/2016 |
| CN | 106159132 A | 11/2016 |
| CN | 205992550 U | 3/2017 |

OTHER PUBLICATIONS

International Search Report issued in corresponding International application No. PCT/CN2017/094061 dated Oct. 31, 2017.

* cited by examiner

COVER PLATE, METHOD FOR MANUFACTURING COVER PLATE AND ELECTRONIC DEVICE

CROSS-REFERENCE TO RELATED APPLICATION(S)

The present application claims priority to Chinese Patent Application No. 201610645762.6 filed on Aug. 8, 2016, and Chinese Utility Model Application No. 201620851119.4 filed on Aug. 8, 2016, contents of both of which are hereby incorporated by reference in their entireties.

TECHNICAL FIELD

The present disclosure relates to electronic devices, and more particularly, to a cover plate, a method of manufacturing the cover plate, and an electronic device having the cover plate.

BACKGROUND

An antenna, as a component transmitting and receiving signals, is generally accommodated in a mobile phone and covered by a cover plate. However, with the popularity of the metallic appearance of the mobile phone, the radio frequency performance of the antenna may deteriorate due to a fully metalized cover plate of the mobile phone. Furthermore, an external antenna design in a metal cover plate can ingeniously enable a part of the metal cover plate to serve as an antenna which has a signal transmitting and receiving capability stronger than that accommodated in a mobile phone having a cover plate made from material other than metal, such that users can still access the internet or communicate normally even if signals are weak.

When an external antenna design is adopted, a slot should be defined in the cover plate, which is beneficial for the antenna. Radio Frequency requires that filler material in the slot be non-conductive so as to improve radiation performance of the antenna. In general, the slot is filled with plastic such as polyphenylene sulfite (PPS) or polybutylene terephthalate (PBT), while the other part of the cover plate is generally made of aluminum alloy and has an anodized appearance. However, the plastic in the slot has a color quite different from the anodized aluminum alloy, which seriously destroys unity of the cover plate. Therefore, the surfaces of the slot and the cover plate of the mobile phone still need to be improved.

BRIEF DESCRIPTION OF THE DRAWINGS

The foregoing and/or additional aspects and advantages of the present disclosure will become apparent and better understood from the following description of the implementations taken in conjunction with the accompanying drawings.

DETAILED DESCRIPTION

The implementations of the present disclosure will be described in detail hereinafter. Persons skilled in the art will appreciate that the implementations described below are intended to illustrate the present disclosure, and are not to be construed as a limit to the present disclosure. Those without specific technologies and conditions in the implementations are performed according to technologies and conditions common in the art, or according to product specifications, unless specified otherwise.

Figure 1:
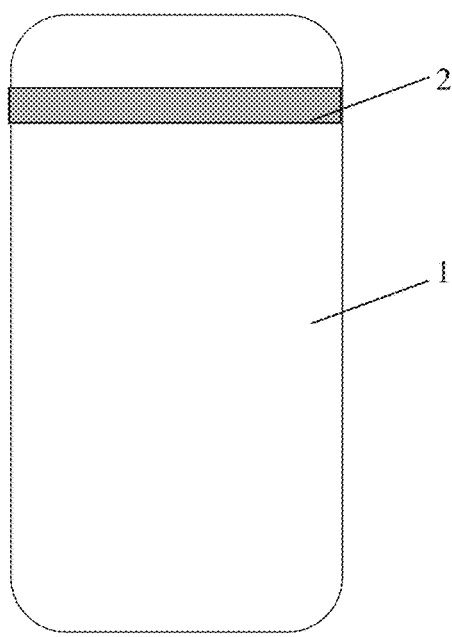
FIG. 1 is a top view of an appearance of a cover plate.
Figure 2:
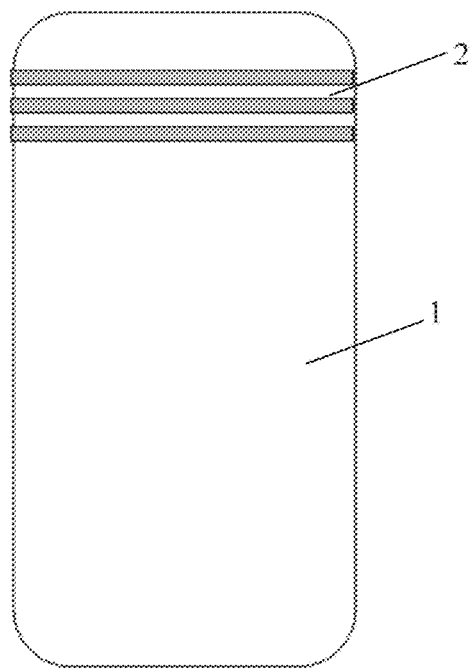
FIG. 2 is a top view of an appearance of another cover plate.
Figure 4:
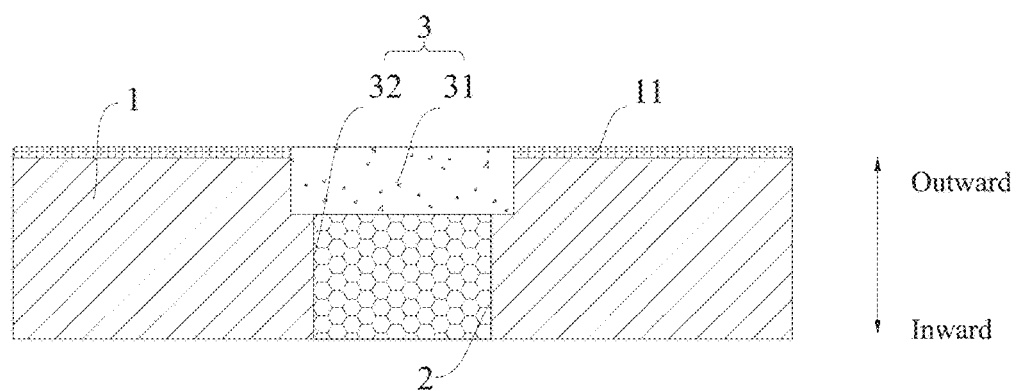
FIG. 4 is a schematic cross-sectional view of a cover plate according to an implementation of the present disclosure.

In one aspect of the present disclosure, a cover plate is provided. FIG. 1 is a top view of an appearance of a cover plate. FIG. 2 is a top view of an appearance of another cover plate. FIG. 4 is a schematic cross-sectional view of a cover plate according to an implementation of the present disclosure. As illustrated in FIG. 4, the cover plate includes a substrate 1, a slot 2 and a filling layer 3.

In one implementation of the present disclosure, the substrate 1 has a shape not particularly limited and may be flexibly shaped by persons skilled in the art, as long as the substrate 1 can be mated with other components constituting an electronic device such as a mobile phone. Furthermore, in one implementation of the present disclosure, the material used for forming the substrate 1 is also not particularly limited, and may be any material known in the art capable of forming the cover plate. For example, the material includes, but is not limited to, metal materials such as aluminum alloy, titanium alloy, magnesium alloy and zinc alloy. Furthermore, in one implementation of the present disclosure, in order to improve surface hardness, abrasion resistance and corrosion resistance of the substrate 1, and prolong service life thereof, generally the surface of the metal substrate 1 is anodized. Therefore, an anodized layer 11 can be formed on the outer surface of the substrate 1.

In one implementation of the present disclosure, as illustrated in FIG. 4, the slot 2 is defined in the substrate 1 and penetrates through the substrate 1 in a thickness direction of the substrate 1, and the slot 2 is filled with the filling layer 3. It will also be appreciated by persons skilled in the art that, the position, shape, number, etc., of the slot(s) 2 are not particularly limited, and any slot known in the art formed for the antenna is applicable to the present disclosure, as long as signals can be transmitted out or received by the antenna. For example, one wide slot 2 can be defined in the substrate as illustrated in FIG. 1, or three narrow slots 2 can be defined in the substrate as illustrated in FIG. 2.

In one implementation of the present disclosure, as illustrated in FIG. 4, the filling layer 3 is received in the slot 2, and includes an insulating layer 32 and a gel layer 31 located on the insulating layer 32. Radio Frequency requires that the material used for forming the filling layer 3 be non-conductive so as to improve radiation performance of the antenna. It will also be appreciated by persons skilled in the art that, the material used for forming the insulating layer 32 received in the slot 2 is not particularly limited, may be any insulating material known in the art, and may be flexibly customized by persons skilled in the art. In one implementation of the present disclosure, the material used for forming the insulating layer 32 includes, but is not limited to, plastic such as PPS, PBT.

According to the implementations of the present disclosure, the gel layer 31 can cover the insulating layer 32, and the gel layer 31 can be customized by adjusting ingredients and color thereof so as to effectively and conveniently enable the outer surface of the gel layer 31 to have a color substantially the same as the anodized layer 11, thereby considerably reducing the color difference between the outer surface of the filling layer 3 and the anodized layer 11, effectively improving the effect of disguising the slot 2, and significantly improving the unity of the cover plate.

Moreover, in one implementation of the present disclosure, the gel layer 31 has a width no less than that of the insulating layer 32, thereby ensuring that the gel layer 31 fully covers the insulating layer 32 in the slot 2. In one implementation of the present disclosure, the width of the gel layer 31 is 0.02-0.06 mm larger than that of the insulating layer 32, thereby preventing a part of the insulating layer 32 from being exposed owing to process errors, ensuring that the gel layer 31 fully covers the insulating layer 32 in the slot 2 in the vertical direction, and avoiding affecting the unity of the cover plate.

In addition, in one implementation of the present disclosure, the gel layer 31 has a thickness of 0.4-0.8 mm. In this way, the thickness of the gel layer 31 is appropriate, since the color of the gel layer 31 may not be substantially the same as the outer surface of the substrate 1 if the thickness thereof is less than 0.4 mm, while some of the gel used for forming the gel layer 31 may be unnecessary if the thickness thereof is greater than 0.8 mm.

Furthermore, in one implementation of the present disclosure, the gel used for forming the gel layer 31 is not particularly limited, may be any gel material known in the art, and may be flexibly customized by persons skilled in the art. Moreover, in one implementation of the present disclosure, the gel layer 31 contains at least one selected from a group consisting of silver powder and pigment. In this way, the particle size of the silver powder and the color of the pigment can increase the similarity of the outer surface of the gel layer 31 to the outer surface of the substrate 1, thereby improving the effect of disguising the slot 2. In one implementation of the present disclosure, the gel layer 31 contains 5-20% silver powder by weight. In this way, the outer surface of the gel layer 31 is similar to that of the anodized layer 11 of the substrate 1, since the outer surface of the gel layer 31 may lack sufficient roughness if less than 5% silver powder by weight is contained, while some of the silver powder may be unnecessary if more than 20% silver powder by weight is contained.

Furthermore, in one implementation of the present disclosure, the substrate 1 is made of metal. In this way, the surface hardness, the abrasion resistance and the corrosion resistance of the cover plate can be improved, and the trend towards the metallic appearance of the mobile phone is followed. In one implementation of the present disclosure, the metal used for forming the substrate 1 may be at least one selected from a group consisting of aluminum alloy, titanium alloy, magnesium alloy, and zinc alloy. Moreover, in one implementation of the present disclosure, the metal used for forming the substrate 1 includes, but is not limited to, aluminum alloy.

Furthermore, in one implementation of the present disclosure, the color of the outer surface of the gel layer 31 is the same as that of the anodized layer 11. It should be noted that, the term "same as" as used herein should be construed broadly; thus, it not only means that the color of the outer surface of the gel layer 31 is exactly the same as the anodized layer 11, but also means that the outer surface of the gel layer 31 and the anodized layer 11 have no obvious color difference. Hence, the color difference between the outer surface of the filling layer 3 and the anodized layer 11 is considerably reduced, thereby effectively improving the effect of disguising the slot 2, and significantly improving the unity of the cover plate.

In summary, according to the implementations of the present disclosure, a cover plate is provided. The gel layer of the cover plate can be customized by adjusting ingredients and color thereof so as to effectively and conveniently render the color of the outer surface of the gel layer substantially the same as that of the outer surface of the substrate, thereby considerably reducing the color difference between the outer surface of the filling layer and the anodized layer, effectively improving the effect of disguising the slot, and significantly improving the unity of the cover plate.

In another aspect of the present disclosure, an electronic device is provided.

In one implementation of the present disclosure, the electronic device includes the foregoing cover plate and an antenna covered by the cover plate. The slot of the cover plate is aligned above the antenna, which is beneficial for the antenna transmitting and receiving signals. It will be appreciated by persons skilled in the art that, the electronic device may further include other components in addition to the cover plate, such as a battery, a frame, a screen, a CPU, a memory, an input/output component, a printed circuit board, and so on which are not described in detail herein.

In summary, according to the implementations of the present disclosure, an electronic device is provided. The outer surface of the slot 2 of the electronic device has a color substantially the same as the outer surface of the substrate 1, thereby effectively disguising the slot 2, and significantly improving the unity of the cover plate. It will be appreciated by persons skilled in the art that, the features and advantages described hereinbefore with regard to the cover plate are still applicable to the electronic device, and are not described in detail herein.

Figure 3:
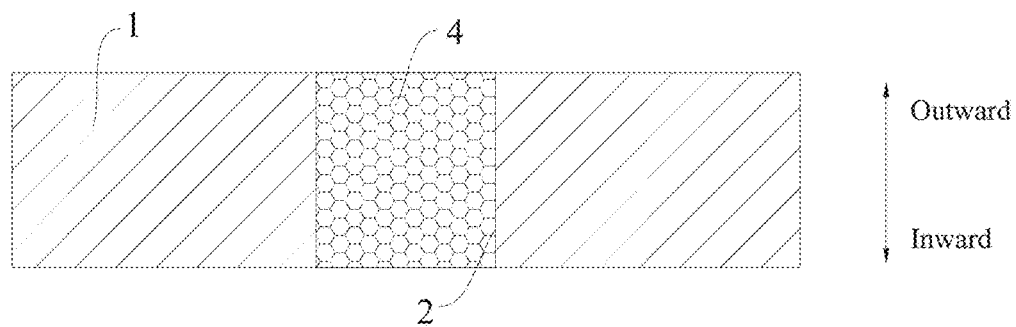
FIG. 3 is a schematic cross-sectional view of a substrate for manufacturing a cover plate according to an implementation of the present disclosure.

In another aspect of the present disclosure, a method for manufacturing a cover plate is provided. Referring to FIGS. 1 to 4, the method for manufacturing the cover plate of the present disclosure is described in detail. As illustrated in FIG. 3, before the method is performed, the cover plate includes a substrate 1, a slot 2 penetrating through the substrate 1, and an insulating material 4 received in the slot 2. After the method is performed, as illustrated in FIG. 4, the cover plate includes the substrate 1, an anodized layer 11 located on the outer surface of the substrate 1, the slot 2 penetrating through the substrate 1, and a filling layer 3 including an insulating layer 32 and a gel layer 31 located on the insulating layer 32.

In one implementation of the present disclosure, the method includes: forming a slot 2 in a substrate 1 and filling the slot 2 with insulating material 4, the slot 2 penetrating through the substrate 1 in a thickness direction of the substrate 1; forming the insulating layer 32 in the slot 2 by removing a part of the insulating material 4 and forming a groove on the insulating layer 32, the groove being adjacent to the outer surface of the substrate 1; and filling the groove with gel so as to form the gel layer 31 in the groove.

In one implementation of the present disclosure, the substrate 1 with the slot 2 filled with the insulating material 4 is as illustrated in FIG. 3. It will be appreciated by persons skilled in the art that, the substrate 1 has a shape not particularly limited and may be flexibly shaped, as long as the substrate 1 can be mated with other components constituting an electronic device such as a mobile phone. Furthermore, in one implementation of the present disclosure, the material used for forming the substrate 1 is also not particularly limited, and may be any material known in the art capable of forming the cover plate. For example, the material includes, but is not limited to, a metal material such as aluminum alloy, titanium alloy, magnesium alloy and zinc alloy.

In one implementation of the present disclosure, as illustrated in FIG. 3, the slot 2 is defined in the substrate 1 and penetrates through the substrate 1 in a thickness direction of the substrate 1, and the slot 2 is filled with the insulating material 4. It will be appreciated by persons skilled in the art that, position, shape, number, etc., of the slot(s) 2 are not particularly limited, and any slot known in the art formed for the antenna is applicable to the present disclosure, as long as signals can be transmitted out or received by the antenna. For example, the slot 2 may be a broad one as illustrated in FIG. 1, or the slots 2 may be three narrow ones as illustrated in FIG. 2. It will also be appreciated by persons skilled in the art that, the insulating material 4 received in the slot 2 is not particularly limited, may be any insulating material known in the art, and may be flexibly customized by persons skilled in the art. In one implementation of the present disclosure, the insulating material 4 includes, but is not limited to, plastic such as PPS, PBT.

It will also be appreciated by persons skilled in the art that, the process for manufacturing the cover plate is not particularly limited, and may be any process known in the art for manufacturing the cover plate. For example, in one implementation of the present disclosure, the method for manufacturing the substrate 1 used for the cover plate includes, but is not limited to molding the substrate 1, forming the slot 2 penetrating through the substrate 1 by cutting, etching, laser processing, or the like, and filling the slot 2 with the insulating material 4 by injection molding (e.g., NMT (Nano Molding Technology)) or the like.

In one implementation of the present disclosure, processes used for forming the insulating layer 32 in the slot 2 and the groove on the insulating layer 32 may include, but are not limited to, a computer numerical control (CNC) process. It will be appreciated by persons skilled in the art that, the process used for forming the insulating layer 32 in the slot 2 and the groove on the insulating layer 32 is not particularly limited, and may be customized by persons skilled in the art. In one implementation of the present disclosure, a part of the insulating material 4 adjacent to the outer surface of the substrate 1 and a part of the substrate 1 adjacent to the part of the insulating material 4 are removed, i.e., a part of the insulating material 4 and a part of the substrate 1 adjacent to the part of the insulating material 4 are removed in the thickness direction of the substrate 1, such that the remaining insulating material 4 forms the insulating layer 32, while the groove having a width larger than the insulating layer 32 is formed on the insulating layer 32 and is adjacent to the outer surface of the substrate 1. For example, the width of the gel layer 31 is 0.02-0.06 mm larger than the width of the insulating layer 32, thereby preventing a part of the insulating layer 32 from being exposed owing to process errors, ensuring that the gel layer 31 fully covers the insulating layer 32 in the slot 2 in the vertical direction, and avoiding affecting the unity of the cover plate.

In addition, in one implementation of the present disclosure, the gel layer 31 has a thickness of 0.4-0.8 mm. In this way, the thickness of the gel layer 31 is appropriate, since the color of the gel layer 31 may not be substantially the same as the outer surface of the substrate 1 if the thickness thereof is less than 0.4 mm, while some of the gel used for forming the gel layer 31 may be unnecessary if the thickness thereof is greater than 0.8 mm.

Furthermore, in one implementation of the present disclosure, the gel used for forming the gel layer 31 is not particularly limited, may be any gel material known in the art, and may be flexibly customized by persons skilled in the art. Moreover, in one implementation of the present disclosure, the gel layer 31 contains at least one selected from a group consisting of silver powder and pigment. In this way, the particle size of the silver powder and the color of the pigment can increase the similarity of the outer surface of the gel layer 31 to the outer surface of the substrate 1, thereby improving the effect of disguising the slot 2. In one implementation of the present disclosure, the gel layer 31 contains 5-20% silver powder by weight. In this way, the outer surface of the gel layer 31 is similar to the substrate 1, since the outer surface of the gel layer 31 may lack sufficient roughness if less than 5% silver powder by weight is contained, while some of the silver powder may be unnecessary if more than 20% silver powder by weight is contained.

Furthermore, in one implementation of the present disclosure, the gel layer 31 is dispensed in the groove in a dispensing process which is performed by a dispenser. The dispenser includes, but is not limited to, a four-axis automatic dispenser which can accurately extrude a specified amount of the gel within a specified time by means of air pressure. The process has the advantages of high efficiency, accuracy, and uniformity. In one implementation of the present disclosure, a nozzle of the automatic dispenser has an inner diameter of 0.1-0.3 mm, such that the gel layer 31 can be uniformly and rapidly formed. Moreover, in one implementation of the present disclosure, the gel from the dispenser has an initial viscosity of 3000-10000 mPa·s, such that the gel layer 31 can be formed uniformly.

Furthermore, in one implementation of the present disclosure, the method may further include horizontally cutting the outer surface of the cover plate. Processes for horizontally cutting the outer surface of the cover plate may include, but are not limited to, a CNC process. It will be appreciated by persons skilled in the art that, the process for horizontally cutting the outer surface of the cover plate is not particularly limited, and may be customized by persons skilled in the art. In one implementation of the present disclosure, a thickness to be cut off is 0.2-0.3 mm. This is because the gel layer 31 may somewhat overflow the edge of the slot 2 in the substrate 1 due to swellability and surface tension after the groove is filled with the gel layer 31 in the dispensing process. Hence, before cutting, the entire outer surface of the substrate 1 should have a process allowance of 0.2-0.3 mm, and after the CNC process, the process allowance of the outer surface of the substrate 1 and the gel flowing out of the slot 2 to the outer surface of the substrate 1 are removed. In this way, the entire outer surface of the cover plate can be flat formed.

Furthermore, in one implementation of the present disclosure, the method may further include anodizing the outer surface of the substrate 1. In one implementation of the present disclosure, after grinding and polishing, the outer surface of the cover plate can be rendered flatter and smoother, and then the outer surface of the substrate 1 is anodized, thereby improving the surface hardness, the abrasion resistance and the corrosion resistance of the cover plate and prolonging the service life thereof. In this way, a colored anodized layer 11 is formed on the outer surface of the substrate 1.

Furthermore, in one implementation of the present disclosure, the color of the outer surface of the gel layer 31 is the same as that of the outer surface of the anodized layer 11, thereby considerably reducing the color difference between the outer surface of the filling layer 3 and the anodized layer 11, effectively improving the effect of disguising the slot 2, and as a result simply and efficiently improving the unity of the cover plate.

In summary, according to the implementations of the present disclosure, a method for manufacturing a cover plate is provided. With the method, the gel layer covering the insulating material can be formed in the slot, and the gel layer can be customized by adjusting ingredients and color thereof so as to simply and conveniently render the color of the outer surface of the gel layer the same as that of the outer surface of the substrate, thereby considerably reducing the color difference between the outer surface of the filling layer and the anodized layer, effectively improving the effect of disguising the slot, and as a result simply and efficiently improving the unity of the cover plate. It will be appreciated by persons skilled in the art that the features and advantages described hereinbefore with regard to the cover plate and the electronic device are still applicable to the method for manufacturing the cover plate, and are not described in detail herein.

In the description of the present disclosure, it should be understood that orientational or positional relationships indicated by the terms "central", "longitudinal", "transverse", "length", "width", "thickness", "upper", "lower", "front", "back", "left", "right", "vertical", "horizontal", "top", "bottom", "inside", "outside", "clockwise", "counterclockwise", "axial", "radial", "circumferential", etc., are those as illustrated in accompanying drawings, and are merely for facilitating and simplifying the description of the present disclosure, rather than indicating or implying that the referred devices or elements should have a specific orientation and should be constructed and operated in a specific orientation, and thus cannot be construed as a limit to the present disclosure.

A detailed description of the present disclosure is provided below with reference to examples. It should be noted that these examples are merely illustrative and are not intended to limit the present disclosure in any way.

Example 1

The aluminum alloy material is processed by casting, pressing, and CNC process, so as to manufacture a substrate with a slot penetrating through the substrate. Insulating material is injected into the slot. Then the substrate is decontaminated, degreased, etched by alkali, washed with water, neutralized, and washed with water, so as to remove contamination on the outer surface of the substrate.

By means of the CNC process, a groove used for forming a gel layer subsequently is formed in the upper part of the slot. The insulating material in the lower part of the slot forms an insulating layer. The groove has a thickness of 0.6 mm, a width 0.06 mm larger than the insulating layer, and a length the same as the insulating layer.

Epoxy resin is used as gel used for forming the gel layer. The epoxy resin contains 15% silver powder by weight, 0.2% yellow pigment by weight, and 0.1% red pigment by weight; thus, the epoxy resin has a golden color and an initial viscosity of 7000 mPa·s. The epoxy resin is uniformly dispensed on the outer surface of the insulating layer by means of a four-axis dispenser having a metal nozzle with an inner diameter of 0.3 mm. The epoxy resin can flow and fully cover the outer surface of the insulating layer due to gravity and capillary effect, so as to form the gel layer. The substrate with the gel layer is heated at 120° C. in a furnace for 30 minutes until the gel layer is fully cured. As a result, a cover plate is formed.

After that, the outer surface of the cover plate is horizontally cut by a thickness of 0.2 mm in a CNC process, so as to remove the epoxy resin flowing out of the groove. Next, the cover plate is polished, so as to improve the metallic texture of the cover plate. Then, the outer surface of the cover plate is sandblasted and wiredrawn. Finally, the outer surface of the cover plate is anodized, so as to form a golden appearance.

Example 2

In this example, a cover plate is manufactured with a method similar to that described in example 1. The method of the example 2 differs in that a gel layer has a thickness of 0.8 mm and a width 0.02 mm larger than an insulating layer; epoxy resin contains 5% silver powder by weight and an initial viscosity of 10000 mPa·s; a metal nozzle has an inner diameter of 0.1 mm; the outer surface of the cover plate is horizontally cut by a thickness of 0.25 mm.

Example 3

In this example, a cover plate is manufactured with a method similar to that described in example 1. The method of the example 3 differs in that a gel layer has a thickness of 0.4 mm and a width 0.03 mm larger than an insulating layer; epoxy resin contains 20% silver powder by weight and an initial viscosity of 3000 mPa·s; a metal nozzle has an inner diameter of 0.2 mm; the outer surface of the cover plate is horizontally cut by a thickness of 0.3 mm.

In the description of this specification, the terms "one implementation", "some implementations", "example", "embodiment", "some examples", or the like is intended to mean that specific features, structures, materials, or characteristics described in conjunction with the implementation or example are included in at least one implementation or example of the present disclosure. In the specification, the exemplary description for the foregoing terms does not necessarily refer to the same implementation or example. Moreover, the described specific features, structures, materials, or characteristics may be combined in an appropriate way in any one or multiple implementations or examples. Furthermore, when not conflicting, different implementations or examples described in the specification as well as features in the different implementations or examples may be conjoined or combined by persons skilled in the art.

Although the implementations of the disclosure have been illustrated and described above, it should be understood that the foregoing implementations are exemplary and are not to be construed as a limit to the present disclosure. Without departing from the scope of the present disclosure, changes, modifications, substitutions, and variations could be made to the foregoing implementations by persons skilled in the art.

What is claimed is:

1. A cover plate for covering an antenna of an electronic device, comprising:
   a substrate;
   at least one slot, defined in the substrate and penetrating through the substrate in a thickness direction of the substrate; and
   a filling layer, received in the at least one slot, comprising an insulating layer and a layer with gel cured, the layer with the gel cured being disposed on the insulating layer, and the layer with the gel cured having a larger width than the insulating layer.

2. The cover plate of claim 1, wherein the layer with the gel cured comprises at least one selected from the group consisting of silver powder and pigment.

3. The cover plate of claim 2, wherein the layer with the gel cured comprises 5-20% silver powder by weight.

4. The cover plate of claim 3, wherein the layer with the gel cured comprises 15% silver powder by weight.

5. The cover plate of claim 2, wherein the layer with the gel cured comprises 0.2% yellow pigment by weight and 0.1% red pigment by weight.

6. The cover plate of claim 1, wherein the width of the layer with the gel cured is 0.02-0.06 mm larger than that of the insulating layer.

7. The cover plate of claim 1, wherein the layer with the gel cured has a thickness of 0.4-0.8 mm.

8. A method for manufacturing a cover plate for covering an antenna of an electronic device, comprising:
   forming at least one slot in a substrate and filling the at least one slot with an insulating material, wherein the at least one slot penetrates through the substrate in a thickness direction of the substrate;
   forming an insulating layer in the at least one slot by removing a part of the insulating material and forming a groove on the insulating layer, wherein the groove is adjacent to an outer surface of the substrate;
   filling the groove with gel; and
   curing the gel so as to form a layer with the gel cured, the layer with the gel cured having a larger width than the insulating layer.

9. The method of claim 8, wherein the forming the insulating layer in the at least one slot by removing the part of the insulating material and forming the groove on the insulating layer comprises:
   removing a part of the insulating material adjacent to the outer surface of the substrate and a part of the substrate adjacent to the part of the insulating material such that the remaining insulating material forms the insulating layer and the groove has a width larger than the insulating layer.

10. The method of claim 8, wherein the gel comprises at least one selected from the group consisting of silver powder and pigment.

11. The method of claim 10, wherein the gel comprises 5-20% silver powder by weight.

12. The method of claim 11, wherein the gel comprises 15% silver powder by weight.

13. The method of claim 10, wherein the gel comprises 0.2% yellow pigment by weight and 0.1% red pigment by weight.

14. The method of claim 8, wherein the gel has an initial viscosity of 3000-10000 mPa·s.

15. The method of claim 14, wherein the initial viscosity of the gel comprises 7000 mPa·s.

16. The method of claim 8, further comprising:
   horizontally cutting an outer surface of the cover plate.

17. The method of claim 8, wherein the substrate is made of metal, and the method further comprises forming an anodized layer on the outer surface of the substrate.

18. An electronic device, comprising a cover plate and an antenna covered by the cover plate, wherein the cover plate comprises:
   a substrate;
   at least one slot, defined in the substrate, penetrating through the substrate in a thickness direction of the substrate, and aligned with the antenna; and
   a filling layer, received in the at least one slot, comprising an insulating layer and a layer with gel cured, the layer with the gel cured being disposed on the insulating layer, and the layer with the gel cured having a larger width than the insulating layer.

19. The cover plate of claim 1, further comprising an anodized layer disposed on the substrate, wherein the anodized layer is adjacent to and aligned with the layer with the gel cured.

20. The electronic device of claim 18, wherein the cover plate further comprises an anodized layer disposed on the substrate, wherein the anodized layer is adjacent to and aligned with the layer with the gel cured.

* * * * *